US012812897B2

(12) United States Patent
Park et al.

(10) Patent No.: US 12,812,897 B2
(45) Date of Patent: Nov. 24, 2026

(54) SEMICONDUCTOR DEVICE HAVING BURIED GATE AND GATE RUNNER AND METHOD FOR MANUFACTURING THE SAME

(71) Applicants: Hyundai Motor Company, Seoul (KR); Kia Corporation, Seoul (KR)

(72) Inventors: Junghee Park, Suwon-si (KR); Dae Hwan Chun, Suwon-si (KR); Jungyeop Hong, Seoul (KR); Youngkyun Jung, Seoul (KR); NackYong Joo, Suwon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 363 days.

(21) Appl. No.: 18/524,202

(22) Filed: Nov. 30, 2023

(65) Prior Publication Data

US 2025/0022950 A1 Jan. 16, 2025

(30) Foreign Application Priority Data

Jul. 13, 2023 (KR) ........................ 10-2023-0090824

(51) Int. Cl.

| | |
|---|---|
| ***H10D 30/66*** | (2025.01) |
| ***H10D 12/01*** | (2025.01) |
| ***H10D 62/10*** | (2025.01) |
| ***H10D 62/832*** | (2025.01) |
| ***H10D 64/00*** | (2025.01) |
| ***H10D 64/01*** | (2025.01) |

(52) U.S. Cl.

CPC ......... *H10D 30/665* (2025.01); *H10D 12/031* (2025.01); *H10D 30/668* (2025.01); *H10D 62/107* (2025.01); *H10D 62/8325* (2025.01); *H10D 64/01* (2025.01); *H10D 64/117* (2025.01)

(58) Field of Classification Search

CPC .... H10D 30/665; H10D 64/01; H10D 64/117; H10D 62/107; H10D 62/8325; H10D 30/668; H10D 12/031; H10D 12/415

See application file for complete search history.

(56) References Cited

U.S. PATENT DOCUMENTS 8,803,251 B2 * 8/2014 Lee ...................... H10D 62/106 257/490
2001/0005031 A1 * 6/2001 Sakamoto ............ H10D 30/202 257/E29.066

(Continued)

FOREIGN PATENT DOCUMENTS

CN 109950199 A * 6/2019

*Primary Examiner* — Caleen O Sullivan
*Assistant Examiner* — Brett Squires
(74) *Attorney, Agent, or Firm* — Slater Matsil, LLP

(57) ABSTRACT

An embodiment semiconductor device includes a conductive region extending in a first direction and a second direction intersecting the first direction and stacked in a third direction intersecting the first direction and the second direction and a termination region at an end of the conductive region in the first direction, wherein the termination region includes an n+ type substrate, an n− type layer disposed on an upper surface of the n+ type substrate and having a plurality of first trenches opening upward in the third direction, and a lower gate runner covering the plurality of first trenches and disposed on an upper surface of the n− type layer.

20 Claims, 8 Drawing Sheets

(56) References Cited

U.S. PATENT DOCUMENTS

| | | | | |
|---|---|---|---|---|
| 2013/0099311 | A1* | 4/2013 | Hao | H10D 30/0295<br>257/334 |
| 2014/0353748 | A1* | 12/2014 | Ma | H10D 64/117<br>257/334 |
| 2021/0381100 | A1* | 12/2021 | Bless | C23C 14/505 |

* cited by examiner

SEMICONDUCTOR DEVICE HAVING BURIED GATE AND GATE RUNNER AND METHOD FOR MANUFACTURING THE SAME

CROSS-REFERENCE TO RELATED APPLICATIONS

This application claims the benefit of Korean Patent Application No. 10-2023-0090824, filed on Jul. 13, 2023, which application is hereby incorporated herein by reference.

TECHNICAL FIELD

The present disclosure relates to a semiconductor device and a method of manufacturing the same.

BACKGROUND

Semiconductor devices (MOSFET, JFET, MESFET, IGBT, etc.) are three-terminal devices that can conduct current through control of the gate terminal. In particular, power semiconductor devices for switching require high voltage and large current.

Semiconductor devices have different electrical characteristics depending on their structure, and appropriate devices are used depending on the application field. However, they commonly require high current density, low turn-on voltage, high breakdown voltage, low leakage current, and fast switching speed, and various structures have been proposed to simultaneously satisfy the above requirements.

However, the above electrical characteristics form a trade-off relationship, and structures for improving one or more characteristics while maintaining other characteristics by weakening the trade-off relationship are continuously being researched.

In particular, MOSFETs and IGBTs, which are mainly used as transistors in power conversion systems, are manufactured with a gate structure in the form of a trench as a method to reduce on-resistance, and even in the trench gate structure, the characteristics (current density and cell pitch) are improved through a buried gate where the gate polysilicon (Poly-Si) is not exposed to the surface.

SUMMARY

One embodiment of the present disclosure provides a semiconductor device and a method of manufacturing the same in which a cell density of a semiconductor device can be increased by reducing a cell pitch through a buried gate electrode structure in which the gate electrode is disposed only inside the trench, a buried gate electrode structure can be easily formed by using a gate recess process that is formed only by an etching process after deposition without forming a separate mask, and a lower gate runner can be formed by using a gate recess process, trenches with specific line widths and spacing, and a deposition method with a non-conformal step coverage.

A semiconductor device according to one embodiment includes a conductive region extending in a first direction and a second direction intersecting the first direction and stacked in a third direction intersecting the first direction and the second direction and a termination region at an end of the conductive region in the first direction.

The termination region includes an n+ type substrate, an n− type layer disposed on a third direction of the n+ type substrate and having a plurality of first trenches opening upward in the third direction, and a lower gate runner that covers the plurality of first trenches and is disposed on a third direction of the n− type layer.

The first direction spacing between the first trenches may be less than or equal to the first direction width of each of the first trenches.

The lower gate runner may have an upper portion that covers the plurality of first trenches and is disposed on a third direction of the plurality of first trenches and extended portions that are disposed inside each of the first trenches.

The extended portion may have a trench sidewall portion disposed on the sidewall of the first trench and a trench bottom portion disposed on the bottom of the first trench.

The trench sidewall portion may have a convex shape toward the inside of the first trench as it moves upward in the third direction.

The trench bottom portion may have a convex shape toward the inside of the first trench.

The first trench may have an empty space inside the first trench surrounded by an upper portion of the lower gate runner, a trench sidewall portion, and a trench bottom portion.

The empty space may have a shape whose width in the first direction becomes narrower as it moves upward in the third direction.

A gate lower insulation layer may be disposed between the first trench and an extended portion of the lower gate runner.

The semiconductor device is disposed within the n− type layer and may further include a p type region disposed on the side of the plurality of first trenches.

The termination region may further include an upper gate runner positioned on the lower gate runner.

The conductive region may include the n+ type substrate, an n− type layer disposed on the n+ type substrate in the third direction and having a second trench opening upward in the third direction, a p type region disposed within the n− type layer and disposed on a side of the second trench, a gate electrode disposed within the second trench, and a source electrode and a drain electrode disposed insulated from the gate electrode.

The gate electrode may be disposed only inside the second trench and may not protrude outside the second trench in the third direction.

The conductive region may further include a gate upper insulation layer that covers the gate electrode and is disposed on the third direction of the n− type layer.

A ratio of the first direction width of the first trench to the first direction width of the second trench may be less than or equal to about 0.9.

The first direction width of the second trench may be greater than or equal to about 0.1 μm.

A third direction depth of the second trench may be greater than or equal to about 0.5 μm.

The first direction width of the first trench may be about 0.1 μm to about 2 μm.

A third direction depth of the first trench may be greater than or equal to about 0.3 μm.

A semiconductor device according to another embodiment includes a conductive region extending in a first direction and a second direction intersecting the first direction and stacked in a third direction intersecting the first direction and the second direction and a termination region at an end of the conductive region in the first direction.

The termination region may include an n+ type substrate, an n− type layer disposed on a third direction of the n+ type substrate, a buffer layer disposed on a third direction of the n− type layer and having a plurality of first trenches opening upward in the third direction, and a lower gate runner that covers the plurality of first trenches and is disposed on the third direction of the buffer layer.

A method of manufacturing a semiconductor device according to another embodiment includes forming an n− type layer on a first direction and a third direction intersecting the second direction of an n+ type substrate extending in a first direction and a second direction intersecting the first direction, forming a plurality of first trenches opening upward in the third direction in the n− type layer, forming a preliminary gate electrode layer covering the plurality of first trenches and an upper portion of the n− type layer without filling all of the interior of the plurality of first trenches using a deposition method with a non-conformal step coverage, and etching a portion of the preliminary gate electrode layer that covers the n− type layer to form a lower gate runner that covers the plurality of first trenches and is disposed on a third direction of the n− type layer.

A third direction thickness of the portion covering the n− type layer of the preliminary gate electrode layer may be about 0.5 times or more than the first direction width of each of the plurality of first trenches.

The deposition method with a non-conformal step coverage may be a plasma-enhanced chemical vapor deposition (PECVD) method using a thermal evaporator.

The method of manufacturing a semiconductor device may further include forming a gate lower insulation layer inside the plurality of first trenches.

The method of manufacturing a semiconductor device may include forming a second trench that is open upward in a third direction in the n− type layer, forming a preliminary gate electrode layer that fills the inside of the second trench and covers the n− type layer using a deposition method with a non-conformal step coverage, etching a portion of the preliminary gate electrode layer covering the n− type layer until the upper surface of the preliminary gate electrode layer is disposed inside the second trench to form a gate electrode inside the second trench, and forming a source electrode and a drain electrode to be insulated from the gate electrode, respectively.

In the method of manufacturing a semiconductor device, a second trench may be formed together during the forming of the plurality of first trenches.

The method of manufacturing a semiconductor device may include, in the forming of the preliminary gate electrode layer, the preliminary gate electrode layer may cover the plurality of first trenches, fill all of the interior of the second trench, and cover the n− type layer without filling all of the interior of the plurality of first trenches.

In the method of manufacturing a semiconductor device, in the forming of the lower gate runner, a portion of the preliminary gate electrode layer covering the n− type layer may be etched until the upper surface of the preliminary gate electrode layer is disposed inside the second trench to form a gate electrode inside the second trench.

A method of manufacturing a semiconductor device may further include forming a gate upper insulation layer that covers a portion of the lower gate runner and forming an upper gate runner disposed on the gate upper insulation layer and connected to the lower gate runner exposed between the gate upper insulation layers.

In the semiconductor device and the manufacturing method thereof according to various embodiments, a cell density of a semiconductor device can be increased by reducing a cell pitch through a buried gate electrode structure in which the gate electrode is disposed only inside the trench, a buried gate electrode structure can be easily formed by using a gate recess process that is formed only by an etching process after deposition without forming a separate mask, and a lower gate runner can be formed by using a gate recess process, trenches with specific line widths and spacing, and a deposition method with a non-conformal step coverage.

DETAILED DESCRIPTION OF ILLUSTRATIVE EMBODIMENTS

Figure 1:
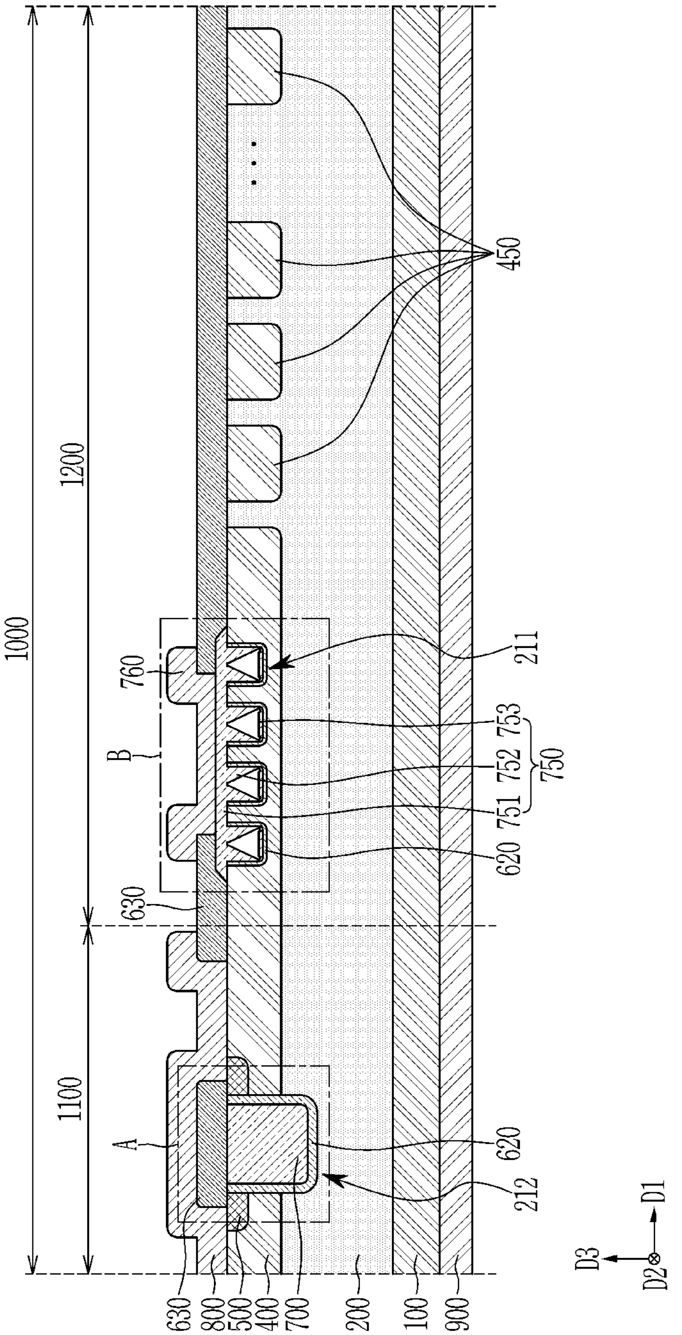
FIG. 1 is a cross-sectional view of a semiconductor device according to one embodiment.

The advantages, features, and aspects to be described hereinafter will become apparent from the following description of the embodiments with reference to the accompanying drawings, which is set forth hereinafter. However, the embodiments should not be construed as being limited to the embodiments set forth herein. Although not specifically defined, all of the terms including the technical and scientific terms used herein have meanings understood by ordinary persons skilled in the art. In addition, unless explicitly described to the contrary, the word "comprise", and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc. are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a semiconductor device 1000 according to one embodiment will be described with reference to FIGS. 1 to 3.

Figure 2:
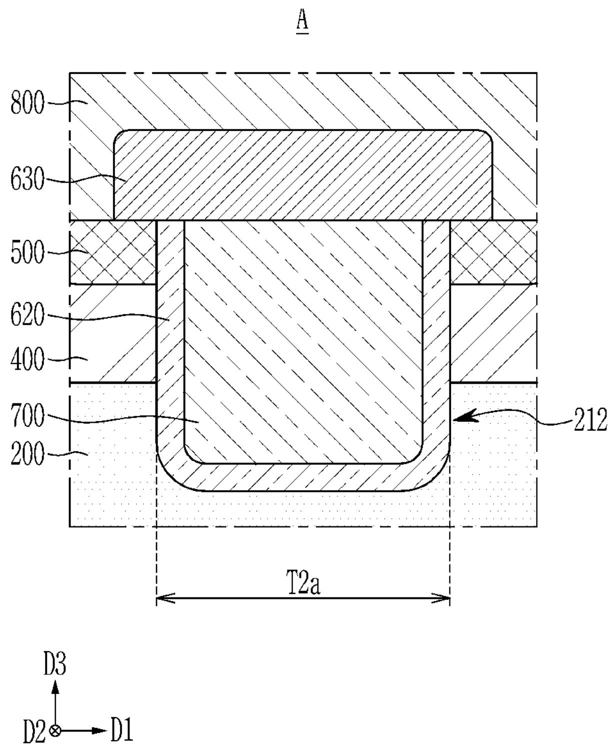
FIG. 2 is an enlarged cross-section of area A of FIG. 1.
Figure 3:
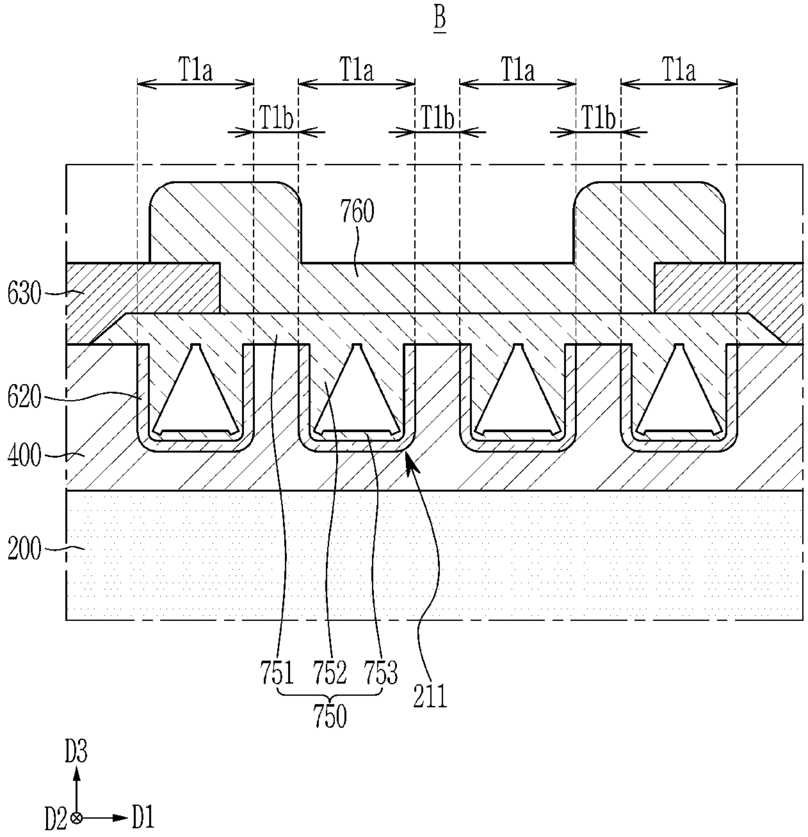
FIG. 3 is an enlarged cross-section of area B in FIG. 1.

FIG. 1 is a cross-sectional view of a semiconductor device 1000 according to one embodiment, FIG. 2 is an enlarged cross-section of area A of FIG. 1, and FIG. 3 is an enlarged cross-section of area B in FIG. 1.

Referring to FIGS. 1 to 3, the semiconductor device 1000 may extend in a first direction D1 and a second direction D2 intersecting the first direction D1 and may be stacked in a third direction intersecting the first direction D1 and the second direction D2. For example, the semiconductor device 1000 may extend in the first and second directions D1 and D2 and may have upper and lower surfaces facing each other in the third direction D3. That is, the first direction D1 may be a width direction of the semiconductor device 1000, the second direction D2 may be an extension direction of the semiconductor device 1000, and the third direction D3 may be a thickness direction of the semiconductor device 1000.

FIG. 1 is a cross-sectional view cut in the first direction D1 and the third direction D3 perpendicular to the second direction D2.

Referring to FIG. 1, the semiconductor device 1000 includes a conductive region 1100 and a termination region 1200. The conductive region 1100 is an area where current flows when a forward voltage is applied, and the termination region 1200 is an area disposed at the end of the conduction region 1100 in the first direction D1.

As an example, the conductive region 1100 of the semiconductor device 1000 includes an n+ type substrate 100, an n− type layer 200, a p type region 400, a gate electrode 700, a source electrode 800, and a drain electrode 900.

The n+ type substrate 100 extends in the first direction D1 and the second direction D2 and may have upper and lower surfaces facing each other in the third direction D3. As an example, the n+ type substrate 100 may be an n+ type silicon carbide (SiC) substrate.

The n− type layer 200 is disposed on the upper surface of the n+ type substrate 100.

The n− type layer 200 of the conductive region 1100 has a second trench 212. The second trench 212 is opened upward, that is, to the upper surface of the n− type layer 200 in the third direction D3.

The p type region 400 is disposed inside the n− type layer 200 and on the side of the second trench 212, that is, next to the second trench 212 in the first direction D1.

An n+ type region 500 may be disposed inside the p type region 400 and on the side of the second trench 212. Additionally, a p+ type region (not shown) may be disposed within the p type region 400 and may be disposed next to the n+ type region 500 in the first direction D1.

Inside the second trench 212, a gate lower insulation layer 620 is disposed, and on the gate lower insulation layer 620, the gate electrode 700 is disposed. The gate electrode 700 fills inside the second trench 212. However, the gate electrode 700 may be a buried gate electrode 700 not protruded outside the second trench 212, while the upper surface of the gate electrode 700 in the third direction D3 is located inside the second trench 212. This gate electrode 700 may reduce a cell pitch of the semiconductor device 1000 to increase cell density of the semiconductor device 1000.

As an example, the gate electrode 700 may include polysilicon or metal.

The gate lower insulation layer 620 may include $SiO_2$, $Si_2N_3$, SiN, $Al_2O_3$, PSG (phospho-silicate glass), USG (undoped silicate glass), BSG (boro-silicate glass), BPSG (boro-phospho-silicate glass), or a combination thereof.

A gate upper insulation layer 630 is disposed on the gate electrode 700. The gate upper insulation layer 630 may be disposed on the n+ type region 500, on the p+ type region (not shown), or on the p type region 400.

The gate upper insulation layer 630 may include $SiO_2$, $Si_2N_3$, SiN, $Al_2O_3$, PSG, USG, BSG, BPSG, or a combination thereof. In addition, the gate upper insulation layer 630 may include the same material as the gate lower insulation layer 620.

On the gate upper insulation layer 630, the source electrode 800 may be disposed. The source electrode 800 is insulated from the gate electrode 700 by the gate upper insulation layer 630. The source electrode 800 may include an ohmic metal.

A drain electrode 900 is disposed on the lower surface of the n+ type substrate 100. The drain electrode 900 may include an ohmic metal.

On the other hand, the termination region 1200 of the semiconductor device 1000 includes the n+ type substrate 100, the n− type layer 200, the p type region 400, a p type termination structure 450, a lower gate runner 750, an upper gate runner 760, and the drain electrode 900.

The p type region 400 located on the side of the second trench 212 adjacent to the termination region 1200 extends to the termination region 1200.

The p type region 400 of the termination region 1200 has a plurality of first trenches 211. The plurality of first trenches 211 are opened upward, that is, to the upper surface of the p type region 400 in the third direction D3. FIG. 1 shows that the first trenches 211 are located in the p type region 400, but embodiments of the present invention are not limited thereto, and the bottom surfaces of the first trenches 211 may be located inside the n− type layer 200 through the p type region 400 depending on a size of the first trenches 211.

A gate lower insulation layer 620 may be disposed inside the first trench 211. The gate lower insulation layer 620 may include $SiO_2$, $Si_2N_3$, SiN, $Al_2O_3$, PSG, USG, BSG, BPSG, or a combination thereof.

The lower gate runner 750 is located on the n− type layer 200 in the third direction D3.

The lower gate runner 750 covers the plurality of first trenches 211 and is on the plurality of first trenches 211 in the third direction D3.

For example, the lower gate runner 750 may include polysilicon or metal.

The lower gate runner 750 covers the plurality of first trenches 211 and has an upper portion 751 on the plurality of first trenches 211 in the third direction D3 and extended portions 752 and 753 located inside each of the first trenches 211.

Herein, in the first trench 211, one inner surface of the first trench 211, which is generally horizontal with the surface of the p type region 400 and has a step of a predetermined depth downward in the third direction D3 and a width in the first direction D1, may be defined as the bottom surface of the trench, other inner surfaces of the first trench 211, which connect the surface of the p type region 400 with the bottom surface of the first trench 211, have a height in the third direction D3, and face each other in the first direction D1, may be defined as the sides of the first trench 211, and a line, where one of the sides of the first trench 211 meets the surface of the p type region 400, may be defined as an upper edge (corner) of the first trench 211.

As described with reference to FIGS. 5 to 8, since the semiconductor device 1000 according to one embodiment is manufactured by using a non-conformal step coverage deposition method in the step of forming a preliminary gate electrode layer 700P, a deposition rate at the upper edge of the first trench 211 may be increased, resulting in overhang deposition. In other words, the deposition (growth) of the preliminary gate electrode layer 700P proceeds around the upper edge of the first trench 211.

Accordingly, spacing T1*b* between the plurality of first trenches 211 in the first direction D1 may be smaller than or the same as a width Tia of each of the plurality of first trenches 211 in the first direction D1. In other words, as the plurality of first trenches 211 have a smaller line width and pitch, a deposition rate of the preliminary gate electrode layer 700P centered on the upper edge of the first trench 211 may be increased during the non-conformal step coverage deposition.

In addition, a ratio of the first direction D1 width Tia of the first trench 211 to the first direction D1 width T2*a* of the second trench 212 may be less than or equal to about 0.9, less than or equal to about 0.8, less than or equal to about 0.7, less than or equal to about 0.6, less than or equal to about 0.5, less than or equal to about 0.4, less than or equal to about 0.3, or less than or equal to about 0.2, and may be greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, or greater than or equal to about 0.8. When the ratio of the first direction D1 width Tia of the first trench 211 to the first direction D1 width T2*a* of the second trench 212 is within the ranges, the deposition rate of the preliminary gate electrode layer 700P centered on the upper edge of the first trench 211 may be increased during the non-conformal step coverage deposition.

Herein, the first direction D1 width T2*a* of the second trench 212 may be greater than or equal to about 0.1 μm, the third direction D3 depth of the second trench 212 may be greater than or equal to about 0.5 μm, the first direction D1 width Tia of the first trench 211 may be about 0.1 μm to about 2 μm, and the third direction D3 depth of the first trench 211 may be greater than or equal to about 0.3 μm.

Accordingly, before filling all inside the plurality of first trenches 211, the openings of the plurality of first trenches 211 are closed during the deposition of the preliminary gate electrode layer 700P, the upper portion 751 of the lower gate runner 750 is formed on the plurality of first trenches 211, and the extended portions 752 and 753 of the lower gate runner 750 are formed inside each of the plurality of first trenches 211.

In addition, the extended portions 752 and 753 of the lower gate runner 750 have the trench sidewall portion 752 located on the side wall of the first trench 211 and the trench bottom portion 753 located on the bottom surface of the first trench 211. For example, the trench sidewall portion 752 may be a thin film disposed on the side surface of the first trench 211, and the trench bottom portion 753 may be a thin film disposed on the bottom surface of the first trench 211. The trench sidewall portion 752 and the trench bottom portion 753 may be connected or not connected to each other.

The trench sidewall portion 752 may have a convex shape toward the inside of the first trench 211 upward in the third direction D3. The reason is that as the non-conformal step coverage deposition method is used, the preliminary gate electrode layer 700P is deposited (grown) to be centered on the upper edge of the first trench 211 and thus has a fan shape on the trench sidewall portion 752 below the upper edge of the first trench 211.

The trench bottom portion 753 has a convex shape toward the first trench 211. The reason is that as the non-conformal step coverage deposition method is used, since the preliminary gate electrode layer 700P is deposited (grows) to be centered on the upper edge of the first trench 211, the trench bottom portion 753 grows relatively less, wherein the trench bottom portion 753 grows much less at the inner edge where the bottom surface of the first trench 211 meets the side surface thereof relative to the center portion of the bottom surface in the first direction D1.

Before the preliminary gate electrode layer 700P fills all inside the plurality of first trenches 211, as the openings of the plurality of first trenches 211 are closed, each of the first trenches 211 may have an empty spaces or a void therein.

As the extended portions 752 and 753 of the lower gate runner 750 are located inside each of the plurality of first trenches 211, the empty space may be surrounded with the upper portion 751, the trench sidewall portion 752, and the trench bottom portion 753 of the lower gate runner 750.

In addition, the trench sidewall portion 752 may have a convex shape upward in the third direction D3 toward the inside of the first trench 211, wherein since the trench sidewall portions 752 located on both sidewalls inside the first trench 211 may meet each other at the top of the first trench 211 in the third direction D3, the empty space may have a shape of which the first direction D1 width becomes narrower as it goes upward in the third direction D3.

The gate upper insulation layer 630 may be disposed on the lower gate runner 750. The gate upper insulation layer 630 may not completely cover the lower gate runner 750 but may expose a portion of the lower gate runner 750.

An upper gate runner 760 may be disposed on the gate upper insulation layer 630 and may be connected to the portion of the lower gate runner 750 exposed between the gate upper insulation layers 630. The upper gate runner 760 may include the same material as the source electrode 800.

The lower gate runner 750 and the upper gate runner 760 are to apply a gate voltage fast to the gate electrode 700.

The p type termination structure 450 may be located in the n− type layer 200 of the termination region 1200. The p type termination structure 450 may be located at the first direction D1 side of the p type region 400 extended to the termination region 1200.

For example, the p type termination structure 450 includes a plurality of regions to which p type ions are implanted, wherein the regions have a filled ring structure in which they are spaced apart from each other at a predetermined distance.

A thickness of the regions into which the p type ions are implanted and which form the p type termination structure 450 may be shallower than a depth of the second trench 212. In addition, the thickness of the regions into which the p type ions are implanted and which form the p type termination structure 450 may be the same as that of the portion of the p type region 400.

The gate upper insulation layer 630 may extend over the p type termination structure 450 and the n− type layer 200 of the termination region 1200.

Hereinafter, the semiconductor device 1000 according to another embodiment will be described with reference to FIG. 4.

Figure 4:
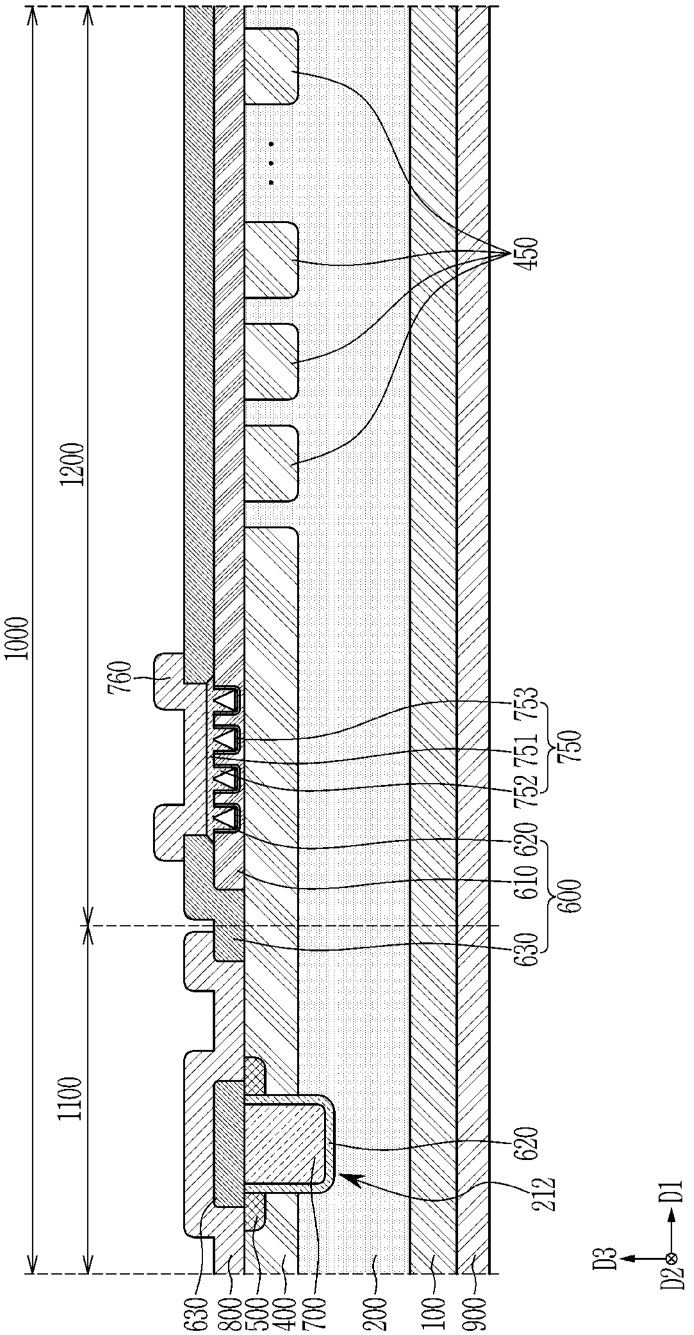
FIG. 4 is a cross-sectional view of a semiconductor device according to another embodiment.
Figure 5:
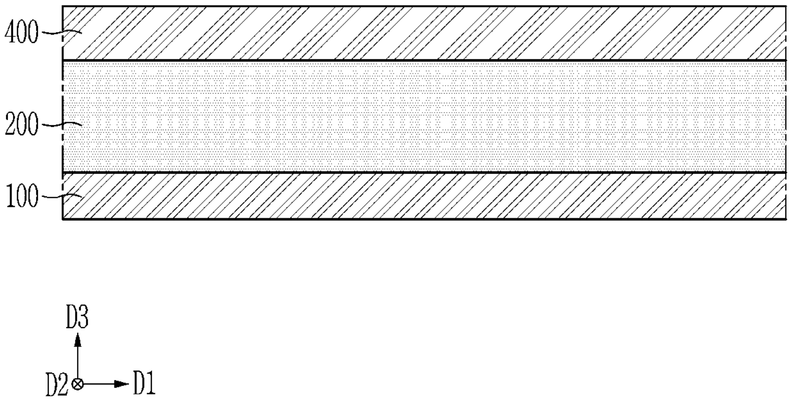
FIGS. 5 to 8 are cross-sectional views showing intermediate steps in a method of manufacturing a semiconductor device according to one embodiment.
Figure 6:
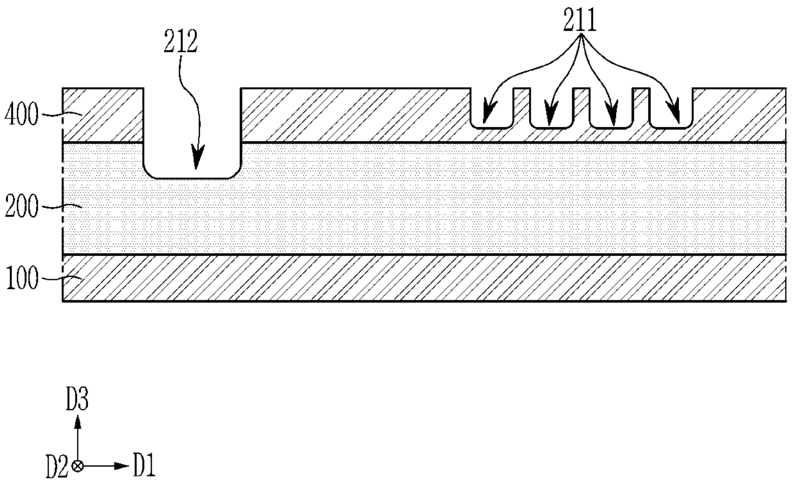
Figure 7:
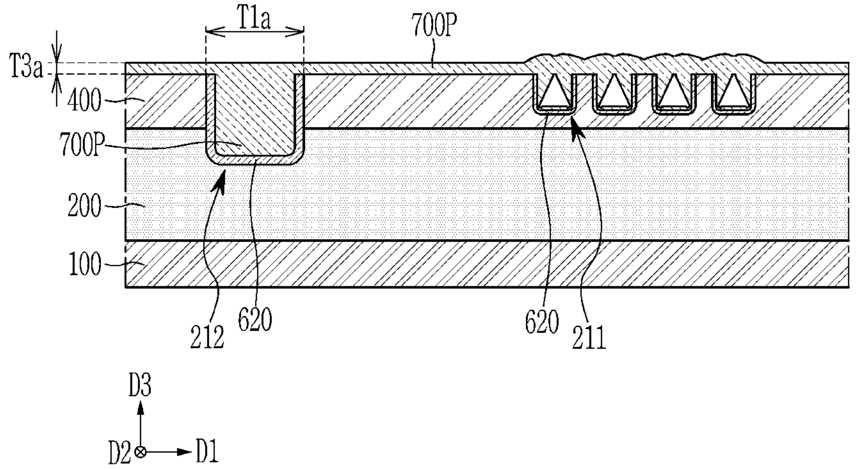
Figure 8:
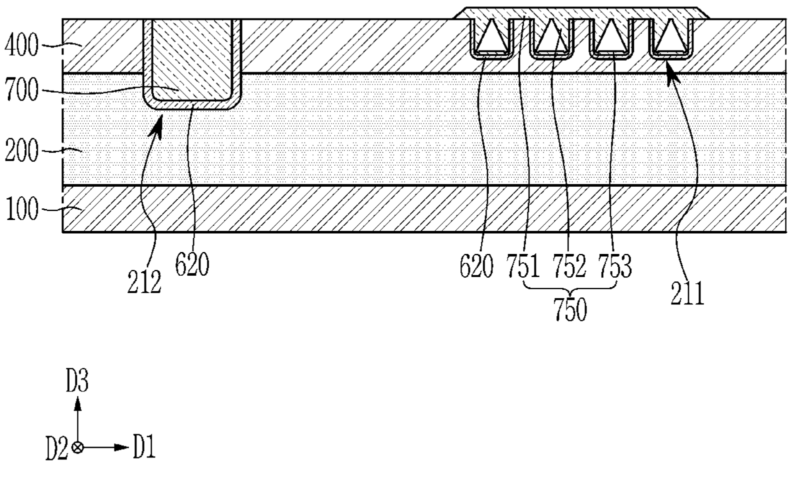

FIG. 4 is a cross-sectional view corresponding to FIG. 1 illustrating the semiconductor device 1000 according to another embodiment.

Since the embodiment shown in FIG. 4 has many of the same parts as the embodiment shown in FIG. 1, descriptions thereof will be omitted and the differences will be mainly explained.

FIG. 1 shows that the n− type layer 200 has the plurality of first trenches 211, and the lower gate runner 750 is positioned on the n− type layer 200.

FIG. 4 shows that the buffer layer 610 is disposed on the n− type layer 200 in the third direction D3 and has the plurality of first trenches 211 opening upward in the third direction D3, and the lower gate runner 750 is positioned on the buffer layer 610 in the third direction D3. Herein, the bottom surface of the first trench 211 may be located inside the n− type layer 200 through the buffer layer 610 according to a size of the first trench 211.

The buffer layer 610 may include $SiO_2$, $Si_2N_3$, SiN, $Al_2O_3$, PSG, USG, BSG, BPSG, or a combination thereof.

In addition, the buffer layer 610 may include the same material as the gate lower insulation layer 620.

The gate upper insulation layer 630 may be disposed on the lower gate runner 750 and the buffer layer 610. However, the gate upper insulation layer 630 may not completely cover the lower gate runner 750 but may expose a portion of the lower gate runner 750.

The upper gate runner 760 may be disposed on the gate upper insulation layer 630 and may be connected to the lower gate runner 750 exposed between the gate upper insulation layers 630. The upper gate runner 760 may include the same material as the source electrode 800.

Hereinafter, a method of manufacturing the semiconductor device 1000 according to one embodiment will be described with reference to FIGS. 5 to 8.

FIGS. 5 to 8 are cross-sectional views showing intermediate steps in a method of manufacturing a semiconductor device 1000 according to one embodiment.

Referring to FIGS. 5 to 8, the n+ type substrate 100 is prepared, and the n− type layer 200 is formed on the upper surface of the n+ type substrate 100. For example, the n− type layer 200 may be formed by epitaxial growth or implantation of n− type ions.

For reference, the n+ type substrate 100 and the n− type layer 200 all are included in the conductive region 1100 and the termination region 1200.

Subsequently, the p type region 400 is formed in the conductive region 1100, and the p type termination structure 450 is formed in the termination region 1200. The p type region 400 may be formed by implanting p type ions into an upper portion of the n− type layer 200. The p type region 400 adjacent to the termination region 1200 is formed to be extended to the termination region 1200 and spaced apart from the p type termination structure 450.

The p type termination structure 450 is formed by implanting the p type ions into the upper portion of the n− type layer 200 of the termination region 1200. The p type termination structure 450 includes a plurality of regions into which the p type ions are implanted, and the regions into which the p type ions are implanted are spaced apart from each other at a predetermined distance.

On the other hand, the p type region 400 may be formed in the termination region 1200, even in the regions where the plurality of first trenches 211 are supposed to be formed. Herein, the plurality of first trenches 211 may be formed by etching the n− type layer 200 or the p type region 400 of the termination region 1200. Herein, a second trench 212 may be formed together in the conductive region 1100. The method of etching the n− type layer 200 and the p type region 400 may be wet etching.

When the plurality of first trenches 211 and the second trench 212 are formed, a hardmask may be formed on the n− type layer 200 and the p type region 400 excluding the regions where the plurality of first trenches 211 and the second trench 212 are supposed to be formed. The hardmask may include, for example, $Si_2N_3$.

The gate lower insulation layer 620 is formed inside the plurality of first trenches 211 and the second trench 212.

Subsequently, the preliminary gate electrode layer 700P is formed to cover the n− type layer 200 by using the non-conformal step coverage deposition method.

As the non-conformal step coverage deposition method is used, a deposition rate at an upper edge of the first trench 211 is increased, resulting in overhang deposition. In other words, the preliminary gate electrode layer 700P is deposited (grows) to be centered on the upper edge of the first trench 211.

For example, the non-conformal step coverage deposition method may be a plasma-enhanced chemical vapor deposition (PECVD) method using a thermal evaporator.

Accordingly, spacing T1*b* between the plurality of first trenches 211 in the first direction D1 may be smaller than or equal to a width Tia of each of the plurality of first trenches 211 in the first direction D1. In other words, as the plurality of first trenches 211 has a narrower line width and pitch, a deposition rate of the preliminary gate electrode layer 700P centered on the upper edge of the first trench 211 may be increased during the non-conformal step coverage deposition.

In addition, a portion of the preliminary gate electrode layer 700P covering the n− type layer 200 may have a third direction D3 thickness which is greater than or equal to about 0.5 times, greater than or equal to about 0.6 times, greater than or equal to about 0.7 times, greater than or equal to about 0.8 times, or greater than or equal to about 0.9 times and less than about 1 time, less than or equal to about 0.9 times, less than or equal to about 0.8 times, less than or equal to about 0.7 times, or less than or equal to about 0.6 times of the first direction D1 width Tia of each of the plurality of first trenches 211.

In addition, a ratio of the first direction D1 width Tia of the first trench 211 to the first direction D1 width T2*a* of the second trench 212 may be less than or equal to about 0.9, less than or equal to about 0.8, less than or equal to about 0.7, less than or equal to about 0.6, less than or equal to about 0.5, less than or equal to about 0.4, less than or equal to about 0.3, or less than or equal to about 0.2, and may be greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, or greater than or equal to about 0.8. When a ratio of the first direction D1 width Tia of the first trench 211 to the first direction D1 width T2*a* of the second trench 212 is within the ranges, the deposition rate of the preliminary gate electrode layer 700P centered on the upper edge of the first trench 211 may be increased during the non-conformal step coverage deposition.

Herein, the first direction D1 width T2*a* of the second trench 212 may be greater than or equal to about 0.1 μm, a third direction D3 depth of the second trench 212 may be greater than or equal to about 0.5 μm, the first direction D1 width Tia of the first trench 211 may be about 0.1 μm to about 2 μm, and a third direction D3 depth of the first trench 211 may be greater than or equal to about 0.3 μm.

Accordingly, before the preliminary gate electrode layer 700P fills in all of the plurality of first trenches 211, as openings of the plurality of first trenches 211 are closed, the upper portion 751 of the lower gate runner 750 is formed on the plurality of first trenches 211, and the extended portions 752 and 753 of the lower gate runner 750 are formed inside each of the plurality of first trenches 211.

Before the preliminary gate electrode layer 700P fills in all of the plurality of first trenches 211, as the openings of the plurality of first trenches 211 are closed, an empty space or a void may be formed inside each of the plurality of first trenches 211.

In addition, the surface of the upper portion 751 of the lower gate runner 750 may include protrusions protruding toward the first direction D1. The reason is that as the non-conformal step coverage deposition method is used, when the preliminary gate electrode layer 700P is deposited (grows) to be centered on the upper edge of the first trench 211, protrusions protruded toward the first direction D1 may be formed on the surface of the upper portion 751 of the lower gate runner 750 above the upper edge of the first trench 211.

However, in the etching step of the preliminary gate electrode layer 700P, since the protruding portions on the surface of the upper portion 751 of the lower gate runner 750 are etched, the surface of the upper portion 751 of the lower gate runner 750 may be smoothed. However, this embodiment is not limited thereto, and in the etching step of the preliminary gate electrode layer 700P, when the entire surface of the upper portion 751 of the lower gate runner 750 is etched at the same rate, the protruding portions may remain on the surface of the upper portion 751 of the lower gate runner 750.

On the other hand, in the step of forming the preliminary gate electrode layer 700P, the preliminary gate electrode layer 700P may fill inside the second trench 212.

Herein, in the step of forming the preliminary gate electrode layer 700P, even though the non-conformal step coverage deposition method is used, since the first direction D1 width Tia of the second trench 212, that is, a line width, is sufficiently large, the preliminary gate electrode layer 700P may fill all inside the second trench 212.

In addition, in the step of forming the lower gate runner 750, until the upper surface of the preliminary gate electrode layer 700P is disposed inside the second trench 212, a portion of the preliminary gate electrode layer 700P covering the n− type layer 200 may be etched to form the gate electrode 700 inside the second trench 212.

In other words, the gate electrode 700 may be a buried gate electrode structure, and the buried gate electrode structure may be simply formed by using a gate recess process with an etching process alone without a separate mask after the deposition. Accordingly, a cell pitch of the semiconductor device 1000 may be reduced to increase cell density of the semiconductor device 1000.

The gate upper insulation layer 630 is formed on the gate electrode 700 and the lower gate runner 750.

After forming a contact hole for exposing a portion of the lower gate runner 750 on the gate upper insulation layer 630, the source electrode 800 is formed in the conductive region 1100, and the upper gate runner 760 is formed in the termination region 1200.

Subsequently, on the lower surface of the n+ type substrate 100, the drain electrode 900 is formed.

While embodiments of this invention have been described in connection with what is presently considered to be practical example embodiments, it is to be understood that the embodiments of the invention are not limited to the disclosed embodiments. On the contrary, they are intended to cover various modifications and equivalent arrangements included within the spirit and scope of the appended claims.

The following reference identifiers may be used in connection with the drawings to describe various features of embodiments of the present invention.

1000: semiconductor device
1100: conductive region
1200: termination region
100: n+ type substrate
200: n− type layer
211: first trench
212: second trench
400: p type region
450: p type termination structure
610: buffer layer
620: gate lower insulation layer
630: gate upper insulation layer
700: gate electrode
700P: preliminary gate electrode layer
750: lower gate runner
751: upper portion of lower gate runner
752: trench sidewall portion of lower gate runner
753: trench bottom portion of lower gate runner
760: upper gate runner
800: source electrode
900: drain electrode

What is claimed is:

1. A semiconductor device comprising:
a conductive region extending in a first direction and a second direction intersecting the first direction and stacked in a third direction intersecting the first direction and the second direction, wherein the conductive region comprises:
an n+ type substrate;
an n− type layer disposed on an upper surface of the n+ type substrate and having a second trench opening upward in the third direction
a p type region disposed within the n− type layer and disposed on a side of the second trench;
a gate electrode disposed within the second trench; and
a source electrode and a drain electrode disposed insulated from the gate electrode; and
a termination region at an end of the conductive region in the first direction, wherein the termination region comprises:
the n+ type substrate;
the n− type layer disposed on the upper surface of the n+ type substrate and having a plurality of first trenches opening upward in the third direction; and
a lower gate runner covering the plurality of first trenches and disposed on an upper surface of the n− type layer, wherein the lower gate runner comprises:
an upper portion covering the plurality of first trenches and disposed on an upper surface of the plurality of first trenches; and
extended portions disposed inside each of the first trenches,
wherein each of the first trenches has an empty space inside the extended portion,
wherein a ratio of a first-trench-first direction width of each of the first trenches to a second-trench-first-direction width of the second trench is less than or equal to 0.9, and
wherein a first-direction spacing between the first trenches is less than the first-direction width of the first trenches.

2. The semiconductor device of claim 1, wherein each of the extended portions comprises:
a trench sidewall portion disposed on a sidewall of the first trenches; and
a trench bottom portion disposed on a bottom of the first trenches.

3. The semiconductor device of claim 2, wherein:
the trench sidewall portion has a convex shape toward an inside of the first trenches as it moves upward in the third direction; and
the trench bottom portion has a convex shape toward the inside of the first trenches.

4. The semiconductor device of claim 3, wherein the empty space of each of the first trenches is surrounded by the upper portion of the lower gate runner, the trench sidewall portion, and the trench bottom portion.

5. The semiconductor device of claim 4, wherein the empty space has a shape whose width in the first direction becomes narrower as it moves upward in the third direction.

6. The semiconductor device of claim 1, wherein the gate electrode is disposed only inside the second trench and does not protrude outside the second trench in the third direction.

7. The semiconductor device of claim 1, wherein:

a second-trench-third-direction depth of the second trench is greater than or equal to 0.5 μm;

the first-trench-first-direction width of each of the first trenches is 0.1 μm to 2 μm; and a first-trench-third-direction depth of each of the first trenches is greater than or equal to 0.3 μm.

8. A semiconductor device comprising:

a conductive region extending in a first direction and a second direction intersecting the first direction and stacked in a third direction intersecting the first direction and the second direction, wherein the conductive region comprises:

an n+ type substrate;

an n− type layer disposed on an upper surface of the n+ type substrate and having a second trench opening upward in the third direction;

a p type region disposed within the n− type layer and disposed on a side of the second trench;

a gate electrode disposed within the second trench; and a source electrode and a drain electrode disposed insulated from the gate electrode; and a termination region at an end of the conductive region in the first direction, wherein the termination region comprises:

the n+ type substrate;

the n− type layer disposed on the upper surface of the n+ type substrate;

a buffer layer disposed on an upper surface of the n− type layer and having a plurality of first trenches opening upward in the third direction; and a lower gate runner covering the plurality of first trenches and disposed on an upper surface of the buffer layer, wherein the lower gate runner comprises:

an upper portion covering the plurality of first trenches and disposed on an upper surface of the plurality of first trenches; and extended portions disposed inside each of the first trenches, wherein each of the first trenches has an empty space inside the extended portion, wherein a ratio of a first-trench-first-direction width of each of the first trenches to a second-trench-first-direction width of the second trench is less than or equal to 0.9, and wherein a first-direction spacing between the first trenches is less than the first-direction width of each of the first trenches.

9. The semiconductor device of claim 8, wherein each of the extended portions comprises:

a trench sidewall portion disposed on a sidewall of the first trenches, and a trench bottom portion disposed on a bottom of the first trenches;

wherein the trench sidewall portion has a convex shape toward an inside of the first trenches as it moves upward in the third direction;

wherein the trench bottom portion has a convex shape toward the inside of the first trenches; and wherein the empty space of each of the first trenches is surrounded by the upper portion of the lower gate runner, the trench sidewall portion, and the trench bottom portion.

10. The semiconductor device of claim 8, wherein the buffer layer comprises a material selected from the group consisting of $SiO_2$, $Si_2N_3$, SiN, $Al_2O_3$, PSG, USG, BSG, BPSG, and combinations thereof.

11. The semiconductor device of claim 8, wherein the termination region further comprises an upper gate runner disposed on the lower gate runner.

12. The semiconductor device of claim 8, wherein the termination region further comprises a p type termination structure located in the n− type layer.

13. The semiconductor device of claim 8, wherein the gate electrode is disposed only inside the second trench and does not protrude outside the second trench in the third direction.

14. The semiconductor device of claim 8, wherein a first-trench-third-direction depth of each of the first trenches is greater than or equal to 0.3 micrometers, and a second-trench-third-direction depth of the second trench is greater than or equal to 0.5 micrometers.

15. A method of manufacturing a semiconductor device, the method comprising:

forming an n− type layer on an upper surface of an n+ type substrate;

forming a plurality of first trenches in the n− type layer, the plurality of first trenches opening upward toward an upper surface of the n− type layer;

forming a preliminary gate electrode layer covering the plurality of first trenches and an upper portion of the n− type layer without filling all of an interior of the plurality of first trenches using a deposition method with a non-conformal step coverage; and etching a portion of the preliminary gate electrode layer that covers the n− type layer to form a lower gate runner that covers the plurality of first trenches and is disposed on the upper surface of the n− type layer, wherein the lower gate runner comprises:

an upper portion covering the plurality of first trenches and disposed on an upper surface of the plurality of first trenches; and extended portions disposed inside each of the first trenches, wherein each of the first trenches has an empty space inside the extended portion;

forming a second trench in the n− type layer, the second trench opening upward toward the upper surface of the n− type layer;

forming the preliminary gate electrode layer that also fills an inside of the second trench and covers the n− type layer using the deposition method with the non-conformal step coverage;

etching a second portion of the preliminary gate electrode layer that covers the n− type layer until an upper surface of the preliminary gate electrode layer is disposed inside the second trench to form a gate electrode inside the second trench; and forming a source electrode and a drain electrode, wherein the source electrode and the drain electrode are each insulated from the gate electrode.

16. The method of claim 15, wherein a first-direction thickness of the portion covering the n− type layer of the preliminary gate electrode layer is 0.5 times or more than a second direction width of each of the plurality of first trenches.

17. The method of claim 15, wherein the deposition method with the non-conformal step coverage comprises a plasma-enhanced chemical vapor deposition (PECVD) method using a thermal evaporator.

18. The method of claim 15, wherein:

forming the second trench is performed while forming the plurality of first trenches;

forming the preliminary gate electrode layer comprises forming the preliminary gate electrode layer covering the plurality of first trenches, filling all of the inside of the second trench, and covering the n− type layer without filling all of the interior of the plurality of first trenches; and etching the second portion of the preliminary gate electrode layer that covers the n− type layer until the upper surface of the preliminary gate electrode layer is disposed inside the second trench to form the gate electrode inside the second trench is performed while etching the portion of the preliminary gate electrode layer that covers the n− type layer to form the lower gate runner.

19. The method of claim 15, wherein each of the extended portions comprises:

a trench sidewall portion disposed on a sidewall of the first trenches, and a trench bottom portion disposed on a bottom of the first trenches;

wherein the trench sidewall portion has a convex shape toward an inside of the first trenches as it moves upward in a third direction;

wherein the trench bottom portion has a convex shape toward the inside of the first trenches; and wherein the empty space of each of the first trenches is surrounded by the upper portion of the lower gate runner, the trench sidewall portion, and the trench bottom portion.

20. The method of claim 15, further comprising forming a gate lower insulation layer inside the plurality of first trenches before forming the preliminary gate electrode layer.

* * * * *